United States Patent [19]

Troue

[11] Patent Number: 4,483,884
[45] Date of Patent: * Nov. 20, 1984

[54] PROCESS FOR PRODUCING TEXTURED COATINGS

[75] Inventor: Harden H. Troue, Plainfield, Ind.

[73] Assignee: Union Carbide Corporation, Danbury, Conn.

[ * ] Notice: The portion of the term of this patent subsequent to Dec. 20, 2000 has been disclaimed.

[21] Appl. No.: 527,986

[22] Filed: Aug. 31, 1983

Related U.S. Application Data

[63] Continuation of Ser. No. 348,345, Feb. 12, 1982, Pat. No. 4,421,784.

[51] Int. Cl.$^3$ .......................... B05D 3/02; B05D 3/06
[52] U.S. Cl. .................................... 427/54.1; 427/379; 427/382
[58] Field of Search ....................... 427/54.1, 379, 382

[56] References Cited

U.S. PATENT DOCUMENTS 4,411,931 10/1983 Duong ............................... 427/54.1
4,421,784 12/1983 Troue ................................ 427/54.1

Primary Examiner—Michael R. Lusignan
Attorney, Agent, or Firm—Saul R. Bresch

[57] ABSTRACT

In a process for providing a coating of different textures on a substrate comprising applying an ultraviolet light curable coating; increasing its viscosity and initiating texturing by exposure to ultraviolet light; maintaining in a dark space to complete texturing; and curing, the improvement comprising providing dark and light colored backgrounds and increasing the viscosity over the dark background to a lesser extent than the viscosity over the light background.

6 Claims, No Drawings

PROCESS FOR PRODUCING TEXTURED COATINGS

This application is a continuation of our prior U.S. application Ser. No. 348,345 filed Feb. 12, 1982 now U.S. Pat. No. 4,421,784, patented Dec. 20, 1983.

TECHNICAL FIELD

This invention relates to a process for providing a textured and photocured coating on a substrate.

BACKGROUND ART

It is well known in the photocure art to provide various finishes for substrate coatings such as flat, glossy, or wrinkle finishes, or intermediate variations of these finishes. These finishes have, up to the present, been attained by using particular chemical formulations or additives such as flatting pigments; allowing a time interval between exposures to ultraviolet light; curing all of the coating, but the surface, and then subjecting the coated substrate to ultraviolet radiation in air until the surface is fully cured; with ultraviolet light, first obtaining a partial cure in air of the interior and exterior coating, the former to a greater degree, second, curing the exterior more than the interior, and finally curing the interior; curing in air all of the coating except for its surface and then irradiating in an inert atmosphere; and curing first the interior of the coating and then the exterior at particular irradiation levels.

The textured finish is of concern here. The term "textured" is defined as a woven or interwoven appearance characterized by the number of weaves or strands per unit of linear distance. This finish is produced by providing a time interval between exposures to ultraviolet light. Unfortunately, this process as it is presently practiced is limited with respect to its capability of (i) providing different texture densities using the same coating, i.e., the provision of a controlled range of texture densities running from coarse to fine to very fine to ultra-fine to texture free; (ii) yielding what is considered to be an ultra-fine texture ("ultra-fine texture" is defined as greater than 150 weaves or strands per inch.); (iii) providing improved optical clarity, non-burnishing properties, and rheology; and (iv) providing selective and/or differential texturing.

More specifically, the known texturing process utilizes very thin coatings to achieve sufficient control over the process to provide the desired texture pattern and depth. The disadvantage of the thin coating is that any imperfection in the coating, such as the presence of foreign matter, shows up at the surface resulting in a substantial waste factor. Further, where thin coatings are not used, the typical result is a relatively coarse and deep texture, i.e., relatively fine textures are simply not obtainable with thick coatings using known texturing techniques.

DISCLOSURE OF THE INVENTION

An object of the invention, therefore, is to provide a process for the production of textured coatings wherein the texture density is controlled, ultra-fine, and selective; the coating has desirable optical clarity, non-burnishing, and rheological properties without the utilization of additives; the texture density is independent of coating thickness; and the texture is relatively fine as opposed to coarse.

Other objects and advantages will become apparent hereafter.

According to the present invention, an improvement has been discovered in the known process for curing a coating on a substrate, which coating has a thickness of about 0.1 mil to about 10 mils, with ultraviolet light comprising the following steps:

(a) applying a coating, which is curable with ultraviolet light, to the substrate, said coating having a viscosity, as applied, of at least about 50 centipoises;

(b) exposing the coated substrate to ultraviolet light having wavelengths in the range of about 1800 Angstroms to about 2750 Angstroms in an inert atmosphere for a period of time sufficient to initiate texturing at the surface of the coating;

(c) maintaining the coated substrate from step (b) in a space essentially devoid of ultraviolet light for a period of time sufficient for the surface of the coating to texture; and (d) exposing the coated substrate from step (c) to ultraviolet light having wavelengths in the range of about 1800 to about 4000 Angstroms in an inert atmosphere or air until the coating is essentially cured.

The improvement comprises, after step (a) and prior to step (b), increasing the viscosity of the coating by exposing the coating to ultraviolet light, said viscosity being increased to a viscosity no higher than that at which the coating is capable of being textured in steps (b) and (c), above.

DETAILED DESCRIPTION

Apparatus that can be used to carry out the process is similar to that disclosed in U.S. Pat. No. 3,807,052, which is incorporated by reference herein. In '052, apparatus for carrying out the curing of coating on substrates with ultraviolet mercury lamps is described using the principle of laminar flow inerting by which curing is enhanced through the replacement of oxygen on the surface of a moving coated substrate with an inert gas atmosphere, usually nitrogen. The particular apparatus described is eminently satisfactory for step (d) recognizing that in subject process, however, air can be substituted for the inert gas of '052. The steps preceding step (d) are carried out by merely modifying the apparatus to accommodate the viscosity increasing step and steps (b) and (c). This simply means adding two banks of ultraviolet mercury lamps and a gap or dark space to the front of the '052 apparatus. The overall construction of the structure remains the same, however, insofar as the conveyer belt, gas injection means (where desired), and the body of the apparatus is concerned.

A typical apparatus configuration is 76 inches long operating at 20 feet per minute. The viscosity increasing step is conducted in the first ten inch portion. Step (b) is conducted in the latter half of the next twenty-five inch section. The next twenty-four inch portion is where step (c) is accomplished. This is also where the gas injection means resides. Finally part of step (d), i.e., partial curing, is carried out in the next five inch section. The function of the last twelve inches is to serve as an exit tunnel for inerting and as a light shield. Step (d) may be completed in any one of a number of converted follow-on ultraviolet curing units. The aforementioned configuration is particularly advantageous for those who already possess curing units. In the event that a new fully integrated unit is desired, the five inch portion is extended to about 72 inches so that curing can be completed in the same unit.

Another typical configuration is seventy-eight inches in length wherein the viscosity increasing step is carried out in the first sixteen inch part. There is then a six inch gap followed by a ten inch portion in which nitrogen is dispensed from the gas injection means. Step (b) is then carried out in the next six inch section; step (c) in the next twelve inch section; step (d) in a five inch section followed by a twenty-three inch section in which the process is terminated. Alternatively, twenty-three inches is devoted to step (c) and termination takes place in the last twelve inches. It will be understood that the length of the step (c) section can be varied and the termination section is also varied accordingly, a longer step (c) section meaning a shorter termination section and the converse. Varying the step (c) or dark space section provides added control for the process and a section where compensation can be made for line speed variations.

An improved arrangement adds 12 to 24 inches to the system and provides an air venturi injection means prior to the viscosity increasing section. This is followed by a variable flow air inlet, which reduces the inerting level in the viscosity increasing section. The air is injected perpendicular to the belt and is controlled by a variable inlet damper. The next section is devoted to step (b) after which comes the nitrogen injection means doubling as the step (c) section. The last section is the step (d) section where the process terminates in a full cure.

Advantageous configurations for the variable flow air inlet, which follows the viscosity increasing section, are as follows: where the coated substrate has been fully inerted, the entrance to the air inlet is closed and sealed; where the coated substrate is permitted to enter with air, an upstream air inlet door is opened to permit the entry of air and a downstream door is opened to permit the exit of downstream nitrogen together with the air. In this way air is drawn to the surface of the coated substrate at the beginning of the air inlet section and the downstream nitrogen strips the air in preparation for step (b) in the latter half of the air inlet section. The entire air inlet section is typically about six inches in length.

Typical belt speeds are in the range of about 20 feet per minute to about 120 feet per minute and are preferably about 60 feet per minute to about 80 feet per minute. Air injection, where used, is typically in the range of 100 standard cubic feet per hour per foot of line width to about 400 standard cubic feet per hour per foot of line width and is preferably in the range of about 150 standard cubic feet per hour per foot of line width to about 300 standard cubic feet per hour per foot of line width. Nitrogen (or other inert gas) injection, again where used, is typically in the range of about 50 standard cubic feet per hour per foot of line width to about 650 standard cubic feet per hour per foot of line width. Gas injection, of course, is coordinated with belt speed in order to provide the desired result. Coordination is accomplished by manually adjusting the flow upward as the belt speed is increased. Step (b) is always accompanied by inerting while the viscosity increasing step and steps (c) and (d) can be carried out in air or in an inert atmosphere.

In the viscosity increasing step, the ultraviolet light that is used to achieve the increase in viscosity can have wavelengths in the range of about 1800 to about 4000 Angstroms. The ultraviolet light may be provided by full spectrum mercury lamps, spectrally controlled mercury lamps, black lights, or "L" type germicidal lamps.

According to The Condensed Chemical Dictionary, 6th Edition, Rose, Reinhold Publ. Corp., 1961, "ultraviolet" is defined as the "region of the electromagnetic spectrum including wave lengths from 100 to 3900 A . . . ". Since some definitions expand the range to about 4100 Angstroms, it is understood that "about 4000 Angstroms" is considered here to include this expanded range up to 4100 Angstroms.

The principal source of ultraviolet light or radiation insofar as photocuring is concerned is the medium pressure mercury lamp referred to, for example, in U.S. Pat. No. 3,983,385, also incorporated by reference herein. Typically, such a lamp is made up of a fused quartz envelope or tube sealed at each end. Inside the tube at each of these ends is a tungsten electrode connected to a power conducting wire through an intermediate molybdenum strip, the strip being embedded in the quartz to provide what may be called a quartz to metal seal. The lamp is filled with argon gas and a small amount of mercury prior to sealing. The amount of gas in the tube is such that the internal pressure will be approximately one atmosphere at an operating temperature, which is about 800° C. to 1000° C. The amount of mercury in a full spectrum lamp is such that the full spectrum of ultraviolet light, i.e., all the wavelengths which mercury is capable of radiating, emanates from the tube when energized provided that the quartz composition of the tube has a transmittance of 100 percent with respect to those wave lengths. To obtain the wavelengths required or preferred in this invention, the composition of the quartz is either altered by, for example, doping or a filter, in the form of a Vycor glass jacket or plate, is placed in between the lamp and the surface to be cured. Both the quartz and the Vycor glass filter can be made up, and this is conventional, to provide the desired transmittance, e.g., one which filters out essentially all of the wavelengths below about 3000 Angstroms. A commercial designation of such a lamp is Voltarc H 22C/24 V 17. Another type of lamp or lamp/filter combination removes essentially all of the radiation below about 2000 Angstroms and reduces the transmittance of radiation between about 2000 Angstroms and 2550 Angstroms by at least about 50 percent. This particular lamp is generally known as an "ozone-free" or spectrally controlled lamp. It is made of quartz doped with titanium dioxide and it transmits the ultraviolet light as follows:

| wavelength (Angstroms) | percent transmittance |
| --- | --- |
| less than 2000 | essentially zero |
| 2000 to 2550 | less than 25 |
| 2550 to 3000 | greater than 50 to 75 |
| greater than 3000 | essentially 100 |

A commercial designation for the "ozone-free" or spectrally controlled lamp is Voltarc H22C/24 G,(SC-1).

Curing, such as that referred to in step (d), takes place in ultraviolet light having wavelengths in the range of about 1800 to about 4000 Angstroms and preferably about 2000 to about 4000 Angstroms. The more preferred wavelengths are in the range of about 2500 to about 4000 Angstroms. An alternative, but a compromise, would be to cure with ultraviolet light having wavelengths in the range of about 2000 to about 4000 Angstroms with the provision that at least about 50 percent of the ultraviolet light in the range of about 2000 to about 2500 Angstroms is filtered out.

An example of a full spectrum mercury lamp is a Voltarc H22C/24B. An example of a spectrally controlled lamp is a 2000 to 4000 Angstrom ultraviolet lamp with variable input power of 25 to 75 watts per linear inch of lamp length. An example of black lights is an array of twenty-four lamps of 3000 to 4000 Angstroms with an input of 1 to 2 watts per linear inch. An example of the "L" type germicidal lamp is a 2537 Angstrom ultraviolet lamp without ozone production. The black lights can be mixed with the "L" type germicidals, e.g., in the twenty-four lamp black lights array, twelve "L" type germicidals can be substituted for twelve black lights. Preferably, the germicidals precede the black lights in the array. It is noted that the viscosity increasing lamp, when operated in air, will generally require more power input from the ultraviolet lamps assigned to it than the power input to step (b), i.e., more lamps and/or more powerful lamps.

Typical exposure times in the viscosity increasing section are in the range of about 0.5 to about 50 seconds and are preferably about 1.5 to about 30 seconds. Any increase in viscosity during the viscosity increasing step up to the point at which the coating is capable of texturing in steps (b) and (c) will provide the controlled texturing sought for by subject process.

A test to determine whether the viscosity has been increased to its limit, i.e., the viscosity above which texturing as per steps (b) and (c) will not take place, is called the Diffraction Test.

The "Diffraction Test" is carried out in accordance with the following steps:

1. select an ultraviolet light curable composition;
2. remove any additives, which would render the composition (in the cured state) opaque to all colors of the visible white light spectrum;
3. coat the composition (modified as per step 2, if necessary) onto a clear, i.e., transparent, substrate such as glass;
4. increase the viscosity of the coating by exposing the coated substrate to ultraviolet light having wavelengths in the range of about 1800 to about 4000 Angstroms.
5. after the viscosity is increased, texture the coating using steps (b) through (d) set forth above;
6. the coated substrate is then held up at arm's length between the eye of the operator towards a single incandescent 100 watt tungsten bulb (bulbs of various sizes can be used, e.g., 75 to 150 watt bulbs) about 25 to about 50 feet away so that the operator can see the bulb through the transparent coating and substrate. The bulb can be white, frosted, or clear. The coating passes the Diffraction Test if the operator is able to see a circular rainbow concentric to the white light source. The object here is to focus on a point white light source. The more intense the light source, the greater the distance that can be permitted between the transparent coating and substrate and the source and, conversely, the less intense the source, the shorter the distance between the transparent coating and substrate and the source. The eye is always kept at about arm's length from the coated substrate. As long as the light source is white and provides a point of light to focus on, any type of light can be used, e.g., incandescent or fluorescent. The circular rainbow is made up of concentric bands or rings of color progressing from blue on the inside of the circle closest to the point of light to red on the outside of the circle farthest from the point of light. These color bands indicate that the viscosity level is not too high for a texture pattern to be produced. It should be noted that a transparent pigment present in the coating composition could serve to mask out the band or ring corresponding to the color of the pigment.

A rough test to determine whether the viscosity has been increased above its limit is based on whether or not the coating has been cured during the viscosity increasing step. If the coating has not been cured, it will be readily dissolved by acetone, lacquer thinner, or a similar solvent. If, on the other hand, it has been cured, the coating will survive the rub test, which consists of rubbing the surface of the coating with a cloth saturated with one of the mentioned solvents. If the coating is cured, it will survive vigorous rubbing. The initial viscosity of the coating, as applied, is no different from that at which it is conventionally applied under ambient conditions. Typical viscosity ranges for various coating techniques are as follows:

| Means of applying coating | viscosity range (in centipoises) |
| --- | --- |
| gravure | 50 to 200 |
| roller | 150 to 500 |
| flow | 400 to 1500 |
| screen | 750 to 5000 |
| litho | 5000 to 10,000 |

Generally, of the foregoing, the gravure and litho coatings are the least desirable for subject process.

The increase in viscosity must take place in situ, i.e., after the coating has been applied to the substrate. While infrared energy may be used to further control the viscosity, step (b) is preferably initiated immediately after the viscosity change has been essentially completed. A substantial increase in viscosity, i.e., at least about 25 percent, is generally used to obtain the desired effect. The viscosity is not necessarily uniform throughout the coating, but can vary from top to bottom depending on the wavelength range of the ultraviolet light used in the viscosity increasing step. The substitution of a higher viscosity coating in lieu of the viscosity increasing step or the use of additives to increase the viscosity is not acceptable. The increase in viscosity must be accomplished by means of ultraviolet light. This is described elsewhere in the specification.

Step (b), the step in which texturing (or shrinkage) is initiated, uses ultraviolet lamps having wavelengths in the range of about 1800 to about 2750 Angstroms, and preferably in the range of about 1849 to about 2537 Angstroms. These wavelengths may be achieved by using the full spectrum mercury lamps mentioned above in connection with the viscosity increasing step; however, a more practical lamp is a germicidal lamp having a typical power input per lamp of about one watt per linear inch. The number of lamps needed here will vary according to line speed, the length of the step (b) section, the exposure time, and the size of the lamp array.

Step (c) is usually accomplished by providing a space devoid of ultraviolet light which may be referred to as a dark space. The length of a typical dark space would be twenty-four inches in the 20 to 150 feet per minute range. Other typical space lengths are noted above. This is the place where texturing of the surface proceeds to completion after it is initiated in step (b).

Step (d), is accomplished by using ultraviolet lights having wavelengths in the range of about 1800 Angstroms to about 4000 Angstroms and preferably in the range of about 2000 Angstroms to about 4000 Angstroms to cure the coating. The cure is essentially completed in this step and cannot be reversed. Spectrally controlled or full spectrum ultraviolet mercury lamps generating 100 to 200 watts per linear inch are typical of the lamps used to perform this step.

The coatings used are conventional photocurable coatings. They are useful in subject process if they will texture after being put through steps 1, 2, 3 and 5 of the Diffraction Test. Note that it is not necessary to increase the viscosity to make this determination. This texturing test is especially advantageous in view of the fact that many coatings are proprietary to the manufacturer and thus the chemicals used in the coating are not disclosed to the public.

Some coatings which find utility here are found in U.S. Pat. No. 3,840,448, incorporated by reference herein. Other coatings (both clears and colors) may be found among the conventional ultraviolet light curable (polymerizable) graphic art screen ink compositions. Typically, these screen inks contain one or more of ultraviolet light polymerizable monomers; ultraviolet light polymerizable oligomers; ultraviolet light reactive crosslinking agents; pigments; flow agents; leveling agents; adhesion promotion agents; and ultraviolet light sensitizing agents. Their pigment content is relatively low when compared with lithographic inks, i.e., about 5 percent by weight for screen inks against about 40 percent by weight for lithographic inks.

The components which make up conventional ultraviolet light polymerizable graphic art screen ink compositions are, except for the pigments, generally reactive in the curing environment. The oligomers and monomers typically make up about half of the composition by weight; the adhesion promoter about 15 to 20 percent by weight; the crosslinking agent about 10 to 15 percent by weight; the flow agent or viscosity reducing agent about 5 to 10 percent by weight; and pigments, sensitizing agents, and leveling agents, each about 5 percent by weight.

The oligomers are often acrylate terminated urethanes formed from, for example, the reaction of an aliphatic diisocyanate, a polyester polyol, and hydroxyethylacrylate or toluene diisocyanate, acrylic acid, and penaterythritol. The monomers can be any one of the oligomer reactants, but are usually acrylates. These oligomers and/or monomers usually serve in a diluent capacity in addition to their function as the main part of the ultimate coating. The crosslinking agents are polyfunctional such as neopentyl glycol diacrylate. Other crosslinking agents may be found in U.S. Pat. No. 4,003,751 at column 6, lines 41 to 58, incorporated by reference herein. The ultraviolet light sensitizing agents or photoinitiators are preferably two part compositions, one of the photoinitiators being receptive to those wavelengths which provide a through-cure and the other, to those which provide a surface cure. An example of the surface cure sensitizing agent is dimethoxy phenyl acetophenone and of the through-cure agent, benzophenone. A number of photoinitiators as well as monomeric diluents and leveling agents may be found in U.S. Pat. No. 4,003,877, at column 4, line 50, to column 5, line 58, and column 6, line 67, to column 7, line 9, all incorporated by reference herein. Another list of photosensitizers may be found in U.S. Pat. No. 3,847,767, column 3, lines 48 to 70, which is also incorporated by reference herein. Acrylic monomers, photosensitizers, and crosslinking agents may be found in U.S. Pat. No. 4,023,973 at column 4, line 1, to column 5, line 63, incorporated by reference herein. A list of suitable pigments may be found in U.S. Pat. No. 3,803,109 at column 9, lines 54 to 64, incorporated by reference herein. Screen ink formulations may be found in U.S. Pat. No. 3,803,109, example 7, and "UV Curing: Science and Technology," edited by S. Pappas, Technology Marketing Corporation, 1978, page 201, both incorporated by reference herein. Adhesion promoters compatible with the substrate are often used, e.g., vinyl acetate resin for a vinyl substrate. A useful screen ink formulation may be prepared by first grinding UVIMER DV-775 acrylate terminated urethane oligomer 12.2 parts (by weight); DT-790 red pigment 3.0 parts; and 13-7000 red pigment 0.9 parts and adding to the following mixture which is first ground: UVIMER DV-755 acrylate terminated urethane, oligomer 20.0 parts; UVIMER DV-530 acrylate terminated oligomer 5.0 parts; vinyl acetate resin adhesion promoter 14.0 parts; n-vinyl pyrollidone flow agent (viscosity reducer) 7.0 parts; neopentyl glycol diacrylate crosslinker 10.0 parts; dimethoxy phenyl acetophenone photoinitiator 5.0 parts; and benzophenone photoinitiator 2.0 parts. The first mixture is called the grind portion and the second, the let-down portion.

Other useful oligomers and monomers may be found in U.S. Pat. Nos. 3,661,614; 3,825,479; 4,026,939; 4,056,453; and 4,082,710, all incorporated by reference herein.

The compositions of various other conventional and useful coatings are proprietary to the manufacturer. Their label designations and manufacturer's name are as follows, however:

I. UV 30-99 Graphic O.P. Clear Ink with about 20 percent UV 30–98 viscosity modifier from Colonial Printing Ink Co., East Rutherford, N.J.

II. DURACOTE floor coating from Armstrong World Industries, Lancaster Pa.

III. Naz Flex UV-170 O.P. Clear from Naz Dar Company, Chicago, Ill.

IV. V-1509 Flatted Clear from Polychrome Printing Ink Division, Cincinatti, Ohio.

V. PSG-27 O.P. Clear from Kansas City Coatings, Inc., Kansas City, Mo.

VI. GA-72 Flatted Clear from Dynachem Corp., Tustin, Calif.

VII. UV 580-293 Litho O.P. Clear from Colonial Printing Ink Co. (see I above).

VIII. UV 703 from Polychrome (see IV above).

IX. PSG PB-18 Tsp. Red Ink from Kansas City Coatings (see V above).

X. UV 21033 Flatted Clear from Polychrome (see IV above).

XI. UV 580-290 Litho Overprint Clear from Colonial Printing Ink (see I above).

XII. RC-001 Clear from H. B. Fuller, Minneapolis, Minn.

XIII. V1503 Overprint Clear from Polychrome (see IV above).

XIV. 701 from Polychrome (see IV above).

It should be pointed out here that Syloid silcia gels and other flatting agents are not needed in the coating compositions useful in subject process and, in general, have been found undesirable. Further, the process is generally non-burnishing simply because pigments, fillers, and the like are not used to any meaningful extent.

The substrates upon which the coatings are applied are also conventional, e.g., vinyl plastics, both flexible and rigid, the flexible vinyl being supported or unsupported; nylon plastics; paper; paper board; glass; pressboard; brushed aluminum; and any stock with characteristics similar to the foregoing. Other examples of substrates are Lexan thermoplastic carbonate-linked polymers (hereinafter Lexan polymer) produced by reacting Bisphenol A and phosgene; litho stock; various metals or metal alloys in addition to brushed aluminum, mentioned above, usually in sheet form; polyester plastics and various plastic flooring materials such as vinyl tile, vinyl-asbestos tile, and foamed back sheet goods. The thicknesses of these substrates is generally in the range of about 0.5 mil to about 1000 mils and is preferably in the range of about 5 mils to about 250 mils.

Subject process can be used to manufacture numerous products, e.g., nameplates, faceplates, LED and LCD readout display covers, signature strips for credit cards, floor tiles and floor sheet goods, post cards, greeting cards, non-gloss picture covers, magazine centerfolds, coatings for pictures and art works, poster coatings, non-glare covers for TV tubes and display screens, diffraction sheets for color separation, advertisement copy readability enhancement, replacement for non-glare glass or plastics, low gloss coatings for vinyl products such as wall coverings, low gloss coatings for wood or imitation wood products such as panels, furniture, counter tops, controlled gloss top coats for cabinet tops and other work surfaces, low gloss clear coatings for plastic and paper playing cards, low gloss clear coatings for test patterns, non-gloss separators for photo albums, low gloss visibility enhancement coatings for signs, license plates, emblems, and low gloss with improved optical clarity applications.

Step (a) considers the application of the coating to the substrate and this can be accomplished in many ways, all conventional. For example, the inks may be applied through a screen. Screens of 200, 350 and 420 mesh (threads per linear inch) are commonly used. Other useful techniques for applying coatings to substrates are roll coating, flow or curtain coating, gravure and litho.

After step (a), the viscosity increasing step is carried out. This step is preferably carried out in the presence of air although inert gases can be used. As noted above, any increase in the viscosity of the coating between step (a) and (b) will provide improved and controlled texturing. Any point from a slight increase to a point where the textured coating is still capable of passing the Diffraction Test can be selected. It will be understood that a careful record of the composition and process parameters must be kept so that the same texture can be obtained at any time. In this respect, it is beneficial to have as many constants as possible when embarking on a program for seeking desirable textures for a particular utility, e.g., by using the same apparatus, including UV spectrum, watts per linear inch, UV flux, atmosphere, standard cubic feet per hour flow rates and line speed or belt speed.

One of the characteristics of the coating after it has gone through the increase in viscosity is that the procedure is substantially reversible, e.g., the application of infrared energy will bring the coating back toward its initial viscosity. The infrared energy can, in addition, be used for fine control of the degree of viscosity. Calrod heating units having 50 watts per linear inch input (i.e., per inch of substrate width) are useful for this technique, which also allows for selective variation of the texture pattern over dark vs. light colored substrate areas.

The viscosity increasing step can be carried out with various ultraviolet lamps, some of which were mentioned above. Examples of other ultraviolet lamps and the number of lamps used are as follows: six black light ultraviolet lamps, each providing wavelengths in the 3000 to 4000 Angstrom range (1 to 2 watts input per linear inch); combination of the black lights previously mentioned and 2537 Angstrom "L" type germincidals; spectrally controlled 2000 to 4000 Angstrom ultraviolet lamp with variable input power and delivering 25 to 75 watts per inear inch; a 100 watt per linear inch input spectrally controlled ultraviolet lamp operated at about 64 watts per linear inch (1180 volts A.C. and 1.3 amperes A.C.) and at about 54 watts per linear inch (1200 watts A.C. and 1.1 amperes A.C.), delivering about 2000 to 4000 Angstroms; and Vycor envelope ultraviolet lamp, 3000 to 4000 Angstroms output, operated at an input power of 64 watts per linear inch. The choice of spectral wavelength in the viscosity increasing step (2000 to 4000 Angstroms as against 3000 to 4000 Angstroms) can be very significant with respect to the type of texture achieved (direction of texture growth) and the need for an infrared module for fine viscosity control. In a 2000 to 4000 Angstrom unit, an infrared module can be used to reduce the viscosity of the coating over the dark background areas and keep the viscosity at substantially the same level over the light colored background areas. Thus, the dark areas can be made to texture while the light areas remain glossy and/or have an ultra-fine textured pattern. In a 3000 to 4000 Angstrom unit, the presence of only long ultraviolet wavelengths allows the wavelengths to pass through a clear coating and either be absorbed or reflected from the substrate surface and/or a reflective or non-reflective back-up material in the case of a transparent substrate. The reflected ultraviolet light increases the viscosity level in the reflective areas as against the dark areas providing a decrease in texture over the reflective areas and a relatively greater amount of texture in the non-reflective areas.

It has been demonstrated that in the viscosity increasing step, the layers of the coating and only partially cured (substantially reversible) and tend to remain in a semi-liquid state. The partial cure of the lower layer is demonstrated by the fact that the textured pattern has a tendency to grow downward from the surface of the coating when 2000 to 4000 Angstrom ultraviolet lamps are used in the viscosity increasing step, i.e., the textured pattern is depressed below the coating surface. With 3000 to 4000 Angstrom ultraviolet lamps used in the viscosity increasing step, the texture pattern has a tendency to grow upward from the coating surface, i.e., the textured pattern is raised above the surface. These same 3000 to 4000 Angstrom lamps give the texture more sensitivity to background colors such that coarse textures are produced over dark or non-reflective colors and ultra-fine or glossy textures over light or reflective colors. The 2000 to 4000 Angstrom ultraviolet lamps, on the other hand, give the texturing less sensitivity to background or substrate colors. In this case, about the same texture can be achieved over both dark or non-reflective and light or reflective areas.

We have discussed texturing control in terms of the viscosity increasing step. It should be remembered, however, that the actual texturing is not initiated until step (b) and is not completed until step (c). Thus, what is done in the viscosity increasing step has a profound effect on the balance of the process.

The resulting textures can be so fine as to be visible only under high magnification. In fact, texture weaves or strands about one fifth to one tenth of the size of an about 150 line screen lithodot ($1.3 \times 10^{-3}$ to $6.7 \times 10^{-4}$ inch) have been observed. In addition to the fineness of the texture, extremely uniform textures are achieved even under the poorest of conditions, e.g., when poor screen draw-downs are textured. Variations in viscosity in the viscosity increasing step are observed to affect the fineness of the textured pattern. Fine textures are characterized by a low gloss surface; very fine textures by a medium gloss surface; and ultra-fine textures by a semi-gloss surface.

Simply because of logistics, there is generally a brief delay between the viscosity increasing step and step (b). There is no indication that any delay is required for the process to function properly. Because of physical constraints, there, of course, must be a delay when an infrared module is interjected between the viscosity increasing module and the texturing module (step (b)). In any case, it is preferred that the distance between the viscosity increasing module and the texture initiating module (step b) be as short as possible in order to avoid any uncontrolled changes in viscosity.

Preferred conditions for the viscosity increasing step are as follows:

1. input power range, minimal, of ultraviolet lamp: about 30 to about 45 watts per linear inch;
2. optics: prefocused elliptical optics;
3. spectrum: about 2000 Angstroms to about 4000 Angstroms where the thickness of the coating is equal to or less than 1.0 mil, nominal, and about 3000 Angstroms to about 4000 Angstroms where the thickness of the coating is greater than about 1.0 mil, nominal;
4. power supply: multiple lamp or single lamp supply depending upon the length of the lamp;
5. cooling: convection and radiation only for improved lamp operational stability;
6. substrate control: static hold-down may be used where feasible; and
7. flux: about 500 to about 1100 watts of ultraviolet light per square foot where prefocused and about 150 to about 300 watts per square foot where interfocused.

Adjustment of the lamp output power, i.e., watts per linear inch, in the viscosity increasing step in used to achieve a wide range of textures running from fine to ultra-fine. It is believed that the texture patterns produced by subject process have densities of about 10,000 to about 30,000 texture weaves or threads per linear inch when the Diffraction Test viscosity increase limit is reached. Generally, the texture pattern yields a greater density of texture weaves or threads per inch as the number of ultraviolet lamps is increased. The depth of the texture may, however, be significantly reduced thereby and a more glossy surface may result.

Where the ratio of volume to surface (in the coating) is higher, there is an indication that the input power range can be lowered in view of the reduced effects from oxygen inhibition. In any case, subject process is found to produce highly satisfactory textures with thick coatings. Conversely, high input power ranges are indicated for thinner coatings, which are subject to greater oxygen inhibition.

A three lamp viscosity increasing module has been developed to provide sufficient flexibility for handling a full range of coatings which might be utilized in this process. Typically, the three lamps are in a line above and across (perpendicular to) the path of the coated substrates. Each lamp provides wavelengths in the 2000 Angstrom to 4000 Angstrom spectrum with a input power range of 30 to 40 watts per linear inch. Each lamp is backed by a prefocused reflector, which can be vertically adjusted to defocus, if required. Between each lamp and the coated substrate a Vycor filter for the 3000 to 4000 Angstrom range is provided as required. The focal band (as observed) is about 0.5 inch and the ultraviolet flux is about 800 to 1100 watts per square foot calculated at 26 percent lamp efficiency. Differential or selective texturing, i.e., the ability to texture differentially or selectively over dark or non-reflective and light or reflective backgrounds is suuccessfully accomplished with the three lamp modules. These modules are particularly successful when 2000 to 4000 Angstroms are used for coatings less than 1 mil in thickness and 3000 to 4000 Angstroms for coatings 1 mil or greater in thickness. First, the viscosity is raised to a point where no texturing is achieved over any background colors. Then the input power is reduced or the line speed is increased until the viscosity is reduced to achieve the desired level of texturing over the dark or non-reflective colors. Slight adjustments in viscosity are than made to fine tune the differential or selective texture contrast as desired. As a general rule, fine control and uniformity of the textures of clears on transparent substrates can be enhanced by backing the substrate with either reflective or non-reflective materials during the viscosity increasing step. This procedure can be used instead of changing the input power energy or the line speed to achieve modest viscosity and subsequent texture density changes.

The use of an air atmosphere in the viscosity increasing step can sometimes require a very large input power, thus introducing excessive heat where heat sensitive substrates are concerned. Low power black lights have been used to mitigate this problem with limited success in an air atmosphere. The effect of black lights, however, is greatly enhanced if they are operated in an inert atmosphere, preferably nitrogen, and this technique is suggested.

After the viscosity increasing step is carried out, step (b) is proceeded with, i.e., the coated substrate from the viscosity increasing step is exposed to ultraviolet light having wavelengths in the range of about 1800 Angstroms to about 2750 Angstroms preferably at 1849 and 2537 Angstroms, in an inert atmosphere, preferably nitrogen, for a period of time sufficient to initiate texturing (or shrinkage) at the surface of the coating. The resultant texture must normally be observed under 10 to 50X magnification due to the extreme fineness of the texture weaves or threads. The preferred spectrum for this step (b) is wavelengths at about 1849 Angstroms and about 2537 Angstroms and typical times sufficient to initiate shrinkage are in the range of about 0.25 to about 2.5 seconds. These times, of course, depend on the input power energy, the line speed, and the shrinkage factor of the specific coating used. Typical step (b) parameters are: one germicidal lamp (1849 and 2537 Angstrom) having an input power of one watt per linear inch; inerting by 200 standard cubic feet per hour (scfh) per foot of line width of nitrogen; and a line speed of 23 feet per minute. An ultraviolet flux in the range of about 10 to about 50 watts per square foot (unfocused) is desirable.

After step (b), the coated substrate is passed through or maintained in a space essentially devoid of ultraviolet light (also referred to as dwell, dark, or black space) for a period of time sufficient for the surface of the coating to texture. Typical time periods are about 0.5 to about 30 seconds and preferably about 1 to about 15 seconds, but, again, the length of the space, the line speed, and the amount of texture are considered. In order to determine whether the texture is sufficient for the end use, the surface is observed, both with the naked eye and under high magnification. In this context, texturing and shrinkage are synonymous for it is the shrinkage at the surface of the substrate which provides the ultraviolet textured pattern. A typical dark space is 24 inches long at 20 to 120 feet per minute line speed. It should be pointed out that the parameters of the viscosity increasing step and steps (b) and (c) are the determinants of the ultimate texture of the coated substrate, each complementing and/or compensating for the other, e.g., the viscosity can be increased together with the dark space to provide an ultra-fine texture while both can be reduced to provide a fine texture. The dark space atmosphere can be inerted or can be air atmosphere.

Step (d) is the conventional curing step used in the photocure art. The coated substrate is exposed to ultraviolet light having wavelengths in the range of about 1800 to about 4000 Angstroms in an inert atmosphere such as nitrogen or in air until the coating is essentially cured. In contradistinction to the viscosity increasing step, step (d) is irreversible. Thus, the product of step (d) is the finished product. Preferably, step (d) wavelengths are in the range of about 2000 to about 4000 Angstroms. This step can be accomplished by the use of controlled or full spectrum lamps having an input power of 100 to 200 watts per linear inch and an ultraviolet flux of about 75 to about 2500 watts per square foot where the coating thickness is about 0.25 mil to about 10 mils or even greater.

The invention is illustrated by the following examples:

EXAMPLES 1 TO 38

The process is carried out in the examples in the preferred manner described above.

The apparatus used in these examples is similar to that shown schematically in FIG. 1 of U.S. Pat. No. 3,807,052, mentioned above, and described therein, with two ultraviolet light modules added upstream from the gas injection means. Thus, the viscosity increasing step is conducted in a first module; step (b) is conducted in a second module; step (c) is conducted in the space under the gas injection means, this area being a dark space (essentially devoid of ultraviolet light); and step (d, or the curing step, in a photocure module as in '052. The coated substrate passes on a continuous belt underneath each module, which contains the ultraviolet lamps needed for the particular step. Since step (b) is always carried out in an inert atmosphere, the gas injection means is set up to make this accommodation. Where air is used in the viscosity increasing step, as is the case in these examples, a vent is provided just upstream of the step (b) module to provide an exit for both the air and the inert gas, the inert gas being used not only in step (b), but in steps (c) and (d) as well.

The coatings used are proprietary compositions and each is subjected to the texturing test described above to determine its usefulness in subject process. The coatings are identified by the Roman numeral, which precedes each coating in the specification. The same apparatus is used for the texturing test and the Diffraction Test as is used for the examples. Since the highest viscosities are used to obtain the ultrafine textures, the coatings to be used at the highest viscosities are subjected to the Diffraction Test and the maximum viscosities at which the coatings will pass the Diffraction Test are determined.

The apparatus is 17 feet long and 48 inches wide; the viscosity increasing module is 24 inches long; the step (b) module is 16 inches long; the dark space is 24 inches long; and the step (d) module is 6 feet long. There are 8 inches between the viscosity increasing module and the step (b) module.

The viscosity increasing step is conducted in a three lamp module as described above. Three spectrally controlled ultraviolet lamps are used in the array having wavelengths in the range of 2000 to 4000 Angstroms; each delivering 30 watts per linear inch; each is provided with a prefocused reflector and a Vycor filter for filtering out wavelengths in the 2000 to 3000 Angstrom range. The lamps can be vertically adjusted to defocus, if required. The observed focal band for each lamp is about 0.5 inch and the calculated ultraviolet flux is about 800 watts per square foot. Each lamp has an ultraviolet efficiency of about 26 percent. Note: it is preferred to use multiple lamps in the viscosity increasing step as this provides fine control.

The line speed ranges from 47 feet per minute to 67 feet per minute.

The step (b) module has 6 VH-type germicidal ultraviolet lamps, each having wavelengths at about 1849 Angstroms and 2537 Angstroms; an input power of one watt per linear inch; and an ultraviolet flux variable from about 8 to 50 watts per square foot.

The flow of nitrogen through this step (b) module is about 300 scfh (standard cubic feet per hour) per foot of line width. This same flow rate prevails in step (c) (the dark space) and the step (d) module.

The step (d) module has 6 spectrally controlled ultraviolet lamps, each having wavelengths in the range of 2000 Angstroms to 4000 Angstroms; an input power of 100 watts per linear inch; and an ultraviolet flux of about 150 watts per square foot.

The coatings are applied to the substrate by the screen printing technique using 200 mesh screens except where they are screened onto the substrate using 350 and 420 mesh screens as noted. All coatings have a viscosity of at least about 50 centiposes as applied and are 0.4 to 0.8 mil in thickness.

The variables are set forth in Table I.

TABLE I

| Example | Coating | Substrate | No. of lamps (viscosity increasing step) | Vycor Filters | No. of lamps step (b) | Line speed (Feet per minute) | Result |
| --- | --- | --- | --- | --- | --- | --- | --- |
| 1 | VII | Lexan polymer | 1 | 0 | 2 | 60 | Fine Text. |
| 2 | " | " | 2 | 1 | 2 | 60 | Very Fine Text. |
| 3 | " | " | 3 | 2 | 2 | 60 | Ultra-Fine Text. |

TABLE I-continued

| Example | Coating | Substrate | No. of lamps (viscosity increasing step) | Vycor Filters | No. of lamps step (b) | Line speed (Feet per minute) | Result |
|---|---|---|---|---|---|---|---|
| 4 | III | " | 1 | 0 | 2 | 60 | Fine Text. |
| 5 | " | " | 1 | 1 | 3 | 60 | Ultra-Fine Text. |
| 6 | " | " | 1 | 1 | 2 | 60 | Very Fine Text. |
| 7 | IV | " | 1 | 0 | 6 | 60 | Fine Text. |
| 8 | " | " | 2 | 0 | 6 | 60 | Very Fine Text. |
| 9 | " | " | 3 | 0 | 6 | 60 | Ultra-Fine Text. |
| 10 | VIII | Lexan polymer (350 mesh) | 3 | 0 | 6 | 60 | Ultra-Fine Text. |
| 11 | " | Lexan polymer (420 mesh) | 3 | 0 | 6 | 60 | Ultra-Fine Text. |
| 12 | VI | Lexan polymer | 1 | 0 | 6 | 60 | Fine Text. |
| 13 | " | " | 2 | 0 | 6 | 60 | Very Fine Text. |
| 14 | " | " | 3 | 0 | 6 | 60 | Ultra-Fine Text. |
| 15 | IX | " | 0 | 0 | 6 | 60 | Coarse Text. (Std.) |
| 16 | " | " | 2 | 0 | 6 | 60 | Ultra-Fine Text. |
| 17 | " | " | 3 | 0 | 2 | 60 | Ultra-Fine Text. |
| 18 | I & IX | " | 3 | 0 | 1 | 66 | Ultra-Fine Text. |
| 19 | " | " | 3 | 0 | 1 | 71 | Very Fine Text. |
| 20 | I | " | 0 | 0 | 2 | 60 | Coarse Text. (Std.) |
| 21 | I | " | 0 | 0 | 6 | 60 | Coarse Text. (Std.) |
| 22 | " | " | 1 | 0 | 6 | 60 | Fine Text. |
| 23 | " | " | 2 | 0 | 6 | 60 | Fine Text. |
| 24 | " | " | 3 | 0 | 6 | 60 | Very Fine Text. |
| 25 | " | " | 3 | 0 | 6 | 47 | Ultra-Fine Text. |
| 26 | " | " | 3 | 0 | 6 | 57 | Ultra-Fine Text. |
| 27 | " | " | 3 | 0 | 6 | 67 | Very Fine Text. |
| 28 | " | " | 3 | 0 | 2 | 67 | Fine Text. |
| 29 | V | Lexan polymer with black back-up | 3 | 0 | 1 | 58 | Ultra-Fine Text. |
| 30 | " | | 3 | 0 | 1 | 66 | Ultra-Fine Text. |
| 31 | " | | 2 | 0 | 1 | 66 | Fine Text. |
| 32 | XIV | Lexan polymer | 3 | 0 | 6 | 60 | Ultra-Fine Text. |
| 33 | XIII | " | 3 | 0 | 6 | 60 | Ultra-Fine Text. |
| 34 | I | Litho stock | 0 | 0 | 0 | 60 | High Gloss Finish |
| 35 | " | " | 0 | 0 | 2 | 60 | Coarse Text. (Std.) |
| 36 | " | " | 3 | 0 | 2 | 60 | Very Fine Differential Text. |
| 37 | " | " | 0 | 0 | 6 | 60 | Coarse Text. (Std.) |
| 38 | " | " | 3 | 0 | 4 | 60 | Ultra-Fine Differential Text. |

Notes:
Coarse Text. (Std.) - Low Gloss rough textured surface where any imperfections readily may show
Fine Text. - Low Gloss texture, imperfection free surface
Very Fine Text. - Medium Gloss texture, imperfection free surface
Ultra-Fine Text. - Semi-Gloss texture, imperfection free surface
Differential Text. - Texture over dark on non-reflective areas and gloss over light or reflective areas

EXAMPLES 39 TO 44

Example 1 is repeated except that the module for the viscosity increasing step is changed to one Vycor envelope ultraviolet lamp that has an ultraviolet output of 3000 to 4000 Angstroms and an input power of 64 watts per linear inch. All test applications are made with a number 60 wire wound rod draw down bar. The coating thicknesses are about 4 mils plus or minus 0.5 mil. The substrate is conventional vinyl-asbestos floor tile. The line speed ranges from 20 feet per minute to 120 feet per minute.

The variables are set forth in Table II. It is noted that in all examples the texture is insensitive to plus or minus 0.5 mil variation in coating thickness.

EXAMPLES 45 TO 50

Example 39 is repeated. The coating used is number II. One ultraviolet lamp is used in the step (b) module and one in the step (d) module. The lamps are the same type of lamp that is used in the step (b) module of example 39.

The variables are set forth in Table III. A smooth surface with uniform low gloss level across all areas is obtained.

TABLE II

| Example | Coating | No. of Lamps step (b) | Line speed (feet per minute) | Results |
|---|---|---|---|---|
| 39 | III | 2 | 20 | Fine Text. |
| 40 | III | 6 | 20 | Very Fine Text. |
| 41 | I | 2 | 70 | Very Fine Text. |
| 42 | I | 6 | 70 | Ultra-Fine Text. |
| 43 | I | 2 | 120 | Fine Text. |
| 44 | I | 6 | 120 | Very Fine Text. |

TABLE III

| Example | Coating Thickness (mils) | Line speed (feet per minute) | Results |
|---|---|---|---|
| 45 | 10 | 75 | Ultra-Fine Text. |
| 46 | 5 | 100 | Very Fine Text. |
| 47 | 4 | 125 | Fine Text. |
| 48 | 6 | 125 | Fine Text. |
| 49 | 8 | 125 | Fine Text. |
| 50 | 6 to 9 | 100 | Very Fine Text. |

I claim:
1. In a process for providing a textured coating on a substrate, which coating has a thickness of about 0.1 mil to about 10 mils, comprising the following steps:
 (a) applying a coating, which is curable with ultraviolet light, to the substrate, said coating having a viscosity, as applied, of at least about 50 centipoises;

(b) increasing the viscosity of the coating by exposing the coating to ultraviolet light, said viscosity being increased to a viscosity no higher than that at which the coating is capable of being textured in steps (c) and (d);

(c) exposing the coated substrate to ultraviolet light having wavelengths in the range of about 1800 Angstroms to about 2750 Angstroms in an inert atmosphere for a period of time sufficient to initiate texturing at the surface of the coating;

(d) maintaining the coated substrate from step (c) in a space essentially devoid of ultraviolet light for a period of time sufficient for the surface of the coating to texture; and (e) exposing the coated substrate from step (d) to ultraviolet light having wavelengths in the range of about 1800 Angstroms to about 4000 Angstroms in an inert atmosphere or air until the coating is essentially cured, the improvement comprising, (i) providing a coating, which is essentially devoid of pigment; (ii) providing for the substrate, (A) a substrate, the surface of which is, in part, dark colored and non-reflective to ultraviolet light, and, in part, light colored and reflective to ultraviolet light, or (B) a substrate transparent to ultraviolet light with a background which is, in part, dark colored and non-reflective to ultraviolet light, and, in part, light colored and reflective to ultraviolet light; and (iii) in step (b), increasing the viscosity of the coating, which is above the dark colored part, to a lesser extent than the coating, which is above the light colored part, the viscosity of the coating, which is above the dark colored part, being increased to a viscosity no higher than that at which the coating is capable of being textured in steps (c) and (d), whereby a relatively greater amount of texture is obtained in the coating, which is above the dark colored part than in the coating which is above the light colored part.

2. The process defined in claim 1 wherein, in step (b), the viscosity of the coating above the light colored part is increased to a level at which a gloss finish is obtained in the coating above the light colored part.

3. The process defined in claim 1 wherein, in step (b), the ultraviolet light is provided in wavelengths in the range of about 2000 Angstroms to about 4000 Angstroms.

4. The process defined in claim 1 wherein, in step (b), the ultraviolet light is provided in wavelengths in the range of about 3000 Angstroms to about 4000 Angstroms.

5. The process defined in claim 3 wherein the thickness of the coating is equal to or less than 1.0 mil, nominal.

6. The process defined in claim 4 wherein the thickness of the coating is greater than 1.0 mil, nominal.

* * * * *